United States Patent
Om et al.

(10) Patent No.: US 6,958,925 B1
(45) Date of Patent: Oct. 25, 2005

(54) STAGGERED COMPARE ARCHITECTURE FOR CONTENT ADDRESSABLE MEMORY (CAM) DEVICE

(75) Inventors: Hari Om, Santa Clara, CA (US); Ajay Srikrishna, Fremont, CA (US); Nabil N. Masri, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/746,899

(22) Filed: Dec. 24, 2003

(51) Int. Cl.$^7$ ............................................. G11C 15/04
(52) U.S. Cl. ............. 365/49; 365/189.07; 365/230.03; 365/203; 365/233; 365/168; 365/227
(58) Field of Search ................................ 365/227, 226, 365/49, 189.07, 230.03, 203, 233, 191, 168

(56) References Cited

U.S. PATENT DOCUMENTS

| | | | |
|---|---|---|---|
| 5,383,146 A | 1/1995 | Threewitt | 365/49 |
| 5,440,715 A | 8/1995 | Wyland | 711/108 |
| 5,446,686 A | 8/1995 | Bosnyak et al. | 365/49 |
| 5,448,733 A | 9/1995 | Satoh et al. | 707/2 |
| 5,485,418 A * | 1/1996 | Hiraki et al. | 365/49 |
| 5,602,764 A | 2/1997 | Eskandari-Gharnin et al. | 708/210 |
| 5,852,569 A | 12/1998 | Srinivasan et al. | 493/52 |
| 5,859,791 A | 1/1999 | Schultz et al. | 365/49 |
| 5,870,324 A | 2/1999 | Helwig et al. | 365/49 |
| 5,999,435 A | 12/1999 | Henderson et al. | 365/49 |
| 6,195,277 B1 | 2/2001 | Sywyk et al. | 365/49 |
| 6,240,000 B1 | 5/2001 | Sywyk et al. | 365/49 |
| 6,253,280 B1 | 6/2001 | Voelkel | 711/108 |
| 6,804,744 B1 | 10/2004 | Abbas | 711/108 |
| 2004/0233692 A1 * | 11/2004 | Ao | 365/49 |

* cited by examiner

Primary Examiner—Andrew Q. Tran
(74) Attorney, Agent, or Firm—Bradley T. Sako

(57) ABSTRACT

A content addressable memory (CAM) device (300) can receive a compare data value having a native word size. The compare data value can be split into smaller portions, with one portion can be applied to a first CAM block (302-0) and another being applied to a second CAM block (302-1) on a subsequent clock (CAMCLK) cycle. Activation of circuit elements in the second CAM block (302-1) can be conditioned on first match results (CMATCHA$_0$ to CMATCHA$_n$) generated by first CAM block (302-0).

21 Claims, 13 Drawing Sheets

STAGGERED COMPARE ARCHITECTURE FOR CONTENT ADDRESSABLE MEMORY (CAM) DEVICE

TECHNICAL FIELD

The present invention relates generally to content addressable memory (CAM) devices, and more particularly to the execution of compare operations within CAM devices, and the like.

BACKGROUND OF THE INVENTION

Content addressable memory (CAM) devices, sometimes also referred to as "associative memories", can provide rapid matching functions between an applied data value (e.g., a comparand, compare data, or search key) and stored data values (e.g., entries). Such rapid matching functions are often utilized in routers, network switches, and the like, to process network packets. As but one particular example, a router can use a matching function to match a destination of an incoming packet with an entry in a "forwarding table" to thereby forward a packet toward its ultimate destination.

Among the numerous other applications for CAM devices are access control lists (ACLs) that can control access of a user to various portions of a file system, and translation lookaside buffers (TLBs) that can translate between "virtual" and "real" addresses in a computer system.

A typical CAM device can store a number of data values in a CAM cell array. In a compare (i.e., match) operation, entries can be compared to a compare data value. An entry that matches the compare data value can result in the generation of a match indication.

A typical CAM device can also include prioritization of match results. That is, if multiple entries match a given compare data value (multiple match case), one entry can be selected as a "winning" entry according to predetermined criteria. In many cases, an entry having the lowest address is selected as the winning entry in a multiple match case.

In many CAM devices, match indications for entries are provided by conductive match lines. Such match lines can be set to a predetermined voltage prior to a compare operation. Subsequently, when a compare operation takes place, the match line(s) corresponding to a mismatch (MISS) result can have a different voltage than a match line having match (HIT) result. Even more particularly, in one type of "miss-sensing" architecture, match lines can be precharged to a "HIT" voltage. In a subsequent compare operation, those match lines corresponding to MISS result can be discharged. Any match lines remaining at the HIT voltage can indicate a HIT result. Conversely, in one type of "hit-sensing" architecture, match lines can be predischarged to a "MISS" voltage, and those match lines corresponding to a HIT result can be charged to a different potential by the compare operation. In any event, as multiple match lines are charged and discharged, current (and hence power) is consumed by a CAM device.

In a conventional CAM device, search operations can be conducted in response to a system clock, with searches being undertaken every clock cycle. As a result, CAM devices can consume considerable power as match lines in the CAM cell array are continuously charged and discharged each clock cycle.

In light of the above, it would be desirable to arrive at some way of reducing the current drawn by a CAM device during search operations.

CAM devices operating in synchronism with a periodic external clock signal, as noted above, can be considered synchronous devices. However, a CAM device can also be an asynchronous CAM, performing matching functions on applied comparand values according to a non-periodic timing signal (such as an applied comparand value, as just one example).

CAM devices can include "binary" CAM devices in which a multi-bit compare data value must match with every bit of a stored data value to generate a match indication. CAM devices can also include "ternary" CAMs in which a multi-bit compare data value can be compared with "maskable" stored data values. As is well understood by those skilled in the art, a "maskable" data value has bits that can be masked from the compare operation. A masked bit will not generate a mismatch indication even if the masked data value bit is different than the corresponding compare value bit. Thus, a match indication can include a binary and/or a ternary match indication, according to the type of CAM device.

Another important feature of integrated circuit devices, such as CAM devices, can be a power supply transient current drawn by such a device. In particular, when a conventional CAM device is not in a search mode, the device may draw a reduced amount of current by not activating the CAM array. However, upon entering a search mode, the CAM device will draw a significant transient current. Transient currents that are undesirably high can be hard to accommodate in some system power supplies.

Accordingly, it would be desirable to arrive at some way of reducing transient currents drawn by a CAM device when switching from a non-search mode to a search mode.

A conventional CAM will now be described to better understand the various disclosed embodiments of the present invention.

Referring now to FIG. 15, one example of a conventional CAM is set forth in a block schematic diagram and designated by the general reference character 1500. A conventional CAM 1500 can include a CAM block 1502, compare data drivers 1504, match sense amplifiers (MSA$_0$ to MSA$_n$) 1506, and result registers (REG$_0$ to REG$_n$) 1508. A CAM block 1502 can include a number (n+1) of rows 1510-0 to 1510-$n$, each of which can include a number of CAM cells, one of which is shown as 1512. CAM cells 1512 of the same row can be commonly connected to a match line MATCH$_0$ to MATCH$_n$. Further, the CAM cells 1512 can also be arranged into a number of columns (Col 0 to Col 79).

A match (compare or search) operation can include a precharge phase and an evaluate phase. During the precharge phase match sense amplifiers 1506 and match lines (MATCH$_0$ to MATCH$_n$) can be precharged to a predetermined voltage prior to the search key being applied. During the evaluate phase, a search key, composed of COMPAREDATA[0:79], can applied to CAM block 1502. In particular, compare data drivers 1504 can apply the search key as complementary values to CAM block 1502. Complementary bit values CD 0/BCD 0 to CD 79/BCD 79 can be applied to corresponding columns (COL 0 to COL 79) of CAM cells 1512.

It is noted that the search key COMPAREDATA[0:79] can be considered a "native" word width. A native word width can be the smallest supported word width of a CAM device. Thus, it is understood that in FIG. 15, a CAM device can include 80 compare data input pins. Multiples of the native word width may also be supported by the CAM device.

In the search operation, the compare data (CD0/BCD0 to CD79/BCD79) can be compared against values stored in the CAM cells 1512. If a mismatch occurs for any CAM cell 1512 of a given row (1510-0 to 1510-*n*), the corresponding match line (MATCH$_0$ to MATCH$_n$) can be discharged to another potential. Otherwise, a match line (MATCH$_0$ to MATCH$_n$) can remain at the precharged potential.

Match sense amplifiers 1506 can sense when a corresponding match line (MATCH$_0$ to MATCH$_n$) remains at a precharged potential, and provides an output that can be held in result registers 1508 to indicate a hit or miss. If more than one hit occurs, a priority encoder (not shown) can determine which hit indication is the "winning" indication (e.g., lowest address entry).

In the most common CAM applications, mismatch results predominate. That is, a typical search operation will generate few, if any match indications, with most rows registering mismatch indications.

From the above description, assuming the CAM 1500 executes a match indication every cycle, once per cycle, the entire CAM block 1502 will be precharged. Further, each match sense amplifier (MSA$_0$ to MSA$_n$) can be enabled, and all compare data drivers 1504 can be activated.

U.S. Pat. No. 6,240,000 issued to Sywyk et al. on May 29, 2001 (hereinafter the '000 patent), discloses a CAM device with a reduced transient current. In the embodiments of the '000 patent, one comparand value can be sequentially compared to different CAM blocks within different portions of a single clock cycle to reduce peak transient currents. In addition, the '000 patent shows embodiments that receive portions of a comparand as input values (native words), and combine search results from such portion to give an overall match result for a comparand larger than a received input value (search values larger than a native word size).

The '000 patent also describes using a mismatch indication from one compare operation to disable precharge and other aspects of a subsequent compare operation in the case of word widths greater than the native word width.

SUMMARY OF THE INVENTION

The present invention includes a method for reducing power consumption in a content addressable memory (CAM) device. The method can include receiving a compare data value of N bits in a CAM device. The compare data value can be split into at least two portions within the CAM device. The method also includes temporally staggering a compare operation between at least two compare data value portions and a plurality of stored data values in the CAM device.

Staggering compare operations of native word size into one or more partial word compare operations can smoothen transient currents.

According to one aspect of the embodiments, temporally staggering compare operation can include switching the states of first match lines in a first block of the CAM device in response to a first portion of the compare data value. This can generate first partial match results. Further, the switching of second match lines in a second block of the CAM device can be conditioned on the first partial match results.

According to another aspect of the embodiments, each first match line can have a corresponding second match line. A first match line can switch from one match state to another match state according to a comparison between a first portion of the compare data value and corresponding data values portions of the first block of the CAM device. Further, conditioning the switching of second match lines can include deactivating a sense amplifier coupled to a second match line when the corresponding first match line switches to the other match state.

By conditioning the switching of second match lines based on first match line results, power consumption can be reduced.

According to another aspect of the embodiments, each first match line can be set to a first potential prior to comparing the at least first portion of the compare data value to data values of the first block of the CAM device. In such an arrangement, conditioning the switching of second match lines can include preventing the corresponding second match line from being set to the first potential when the corresponding first match line switches to the second potential.

According to another aspect of the embodiments, first match lines can be arranged into a group of first match lines corresponding to a group of second match lines. Each first match line can switch from one match state to another match state according to a comparison between a first portion of the compare data value and corresponding data value portions for the first match line. Conditioning the switching of second match lines can include preventing the corresponding group of second match lines from switching from the one match state to another match state when all of the match lines of the group of first match lines have the one match state.

Such arrangements can include preventing precharge operations of second match lines or groups of second match lines, thus reducing power.

In another arrangement, the application of a second portion of the compare data value to the second block of the CAM device can be prevented when all of the match lines of the group of first match lines have the one match state.

Such an arrangement eliminates the need to drive compare data lines for a second CAM block, and thus reduces power consumption.

According to another aspect of the embodiments, temporally staggering the compare operation can include applying at least a first portion of the compare data value to a first block of the CAM device in synchronism with a first cycle of an externally applied clock signal. The method may also include applying at least a second portion of the compare data value to the second block of the CAM device in synchronism with a subsequent cycle of the externally applied clock signal.

Such an arrangement can result in per cycle search result throughput at the cost of some latency.

According to another aspect of the embodiments, temporally staggering the compare operation can include applying a first portion of a first compare data value to a first block of the CAM device in synchronism with first type transition in an externally applied clock signal, and applying a first portion of a first compare data value to a third block of the CAM device in synchronism with second type transition in an externally applied clock signal. Such temporal staggering can further include applying a second portion of the first compare data value to a second block of the CAM device in synchronism with a subsequent first type transition of the externally applied clock signal, and applying a second portion of the first compare data value to a fourth block of the CAM device in synchronism with a subsequent second type transition of the externally applied clock signal.

Such a feature can allow for double data rate processing of search results.

The present invention can also include a CAM device that includes a compare data input for receiving a compare data value of N bits at essentially the same time for comparison with a plurality of stored data values. A plurality of CAM cell blocks can each store a portion of the stored data values. Each portion of the stored data values can be less than N bits. Compare results of a first block of the CAM cell blocks can control the activation of circuits in at least a second block of the CAM cell blocks.

By controlling activation of circuits in the second block according to match results in the first block, power can be reduced as compared to arrangements that activate one native word size block.

According to one aspect of the embodiments, each of the CAM cell blocks can include a plurality of match lines that indicates if the portions of the stored data values match a corresponding portion of the compare data value. In addition, the CAM device can include second sense amplifiers corresponding to each match line of the second block. Each second sense amplifier can be enabled in response to the state of a corresponding first match line in the first block of the plurality of blocks.

By only enabling a portion (or none) of the second sense amplifiers, power consumption can be reduced.

According to another aspect of the embodiments, a CAM device can include second precharge circuits corresponding to each match line of the second block. Each second precharge circuit can be enabled in response to the state of a corresponding first match line in the first block.

By only enabling a portion (or none) of the match lines in the second block, power consumption can be reduced.

According to another aspect of the embodiments, a CAM device can include a detect circuit coupled to the first block that generates a group match indication when a plurality of match lines in the first block all indicate a predetermined match state. The CAM device can also include a compare data driver circuit for applying a second portion of the compare data value to a second block. The compare data driver circuit can be disabled in response to the group match indication.

When the compare data driver circuit for the second block is disabled, power can be reduced.

According to another aspect of the embodiments, each of the plurality of blocks can include a plurality of CAM cells selected from the group consisting of ternary CAM cells and binary CAM cells.

According to another aspect of the embodiments, the plurality of blocks can further include a third block and a fourth block. A first compare data driver circuit can apply a portion of a first compare data value to the first block in synchronism with a first type transition of an external clock signal. A third compare data driver circuit can apply a portion of a first compare data value to the third block in synchronism with a second type transition of the external clock signal. A second compare data driver circuit can apply another portion of the first compare data value to the second block in synchronism with a subsequent first type transition of the external clock signal. A fourth compare data driver circuit can apply another portion of the first compare data value to the fourth block in synchronism with a subsequent second type transition of the external clock signal.

According to another aspects of the embodiments, splitting the compare data value into at least two portions can include splitting the compare data value into greater than two portions. In addition, temporally staggering the compare operation can include comparing a first portion of the compare data value in synchronism with a first clock type transition, and comparing each remaining portion on different subsequent first clock type transition.

The present invention may also include a CAM device that includes an input for receiving compare data values as N bits in parallel. The CAM device can include a first CAM block with a plurality of first match lines corresponding to first stored data value portions of less than N bits. Each first match line can provide a first match indication when the corresponding first stored data value portion matches a first compare data portion, and can provide a second match indication when the corresponding first stored data portion does not match the first compare data portion. A second CAM block can include a plurality of second match lines corresponding to second stored data value portions of less than N bits. Each second match line can provide a second match indication dependent upon the first match indication of a corresponding first match line.

By making second match line indications dependent upon first match line indications, power can be conserved as only selected second match lines may switch state.

According to one aspect of the embodiments, a CAM may also include an external clock input for receiving an external clock signal. A first CAM block can be inactive in a non-search mode and activated in a search mode. A second CAM block can be inactive in the non-search mode and can be activated no less than about one clock cycle after the first CAM block is activated in the search mode.

By activating a second CAM block after the first CAM block, transient current can be smoothened over conventional arrangements.

According to another aspect of the embodiments, each second match indication can also be dependent upon at least one valid bit associated with the corresponding second stored data value portions.

According to another aspect of the embodiments, a first CAM block can include a valid bit for each first stored data value portion that indicates if the corresponding stored data value is valid.

According to another aspect of the embodiments, each second match indication dependence upon the first match indication is selected from the group consisting of: enabling a sense amplifier coupled to the second match line according to the first match indication, enabling a precharge circuit coupled to the second match line according to the first match indication, and enabling compare data drivers for applying a second comparand portion to the second CAM block according to a plurality of first match indications.

According to another aspect of the embodiments, the bits of the compare data values can be divided into at least a first group and second group. The first group can have a greater expected variation than the second group. The bits of the first group can be included in the first compare data portions, and the bits of the second group can be included in the second compare data portion.

DETAILED DESCRIPTION

Various embodiments of the present invention will now be described in detail with reference to a number of drawings. The embodiments include a content addressable memory (CAM) device and CAM device operating method that can result in less power consumption and/or transient current than other conventional approaches.

Figure 1:
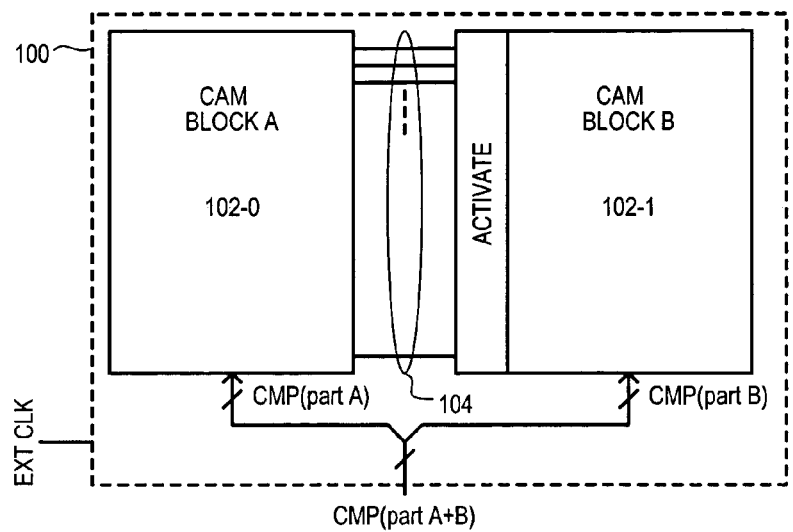
FIG. 1 is a block schematic diagram of a first embodiment of the present invention.

Referring now to FIG. 1, a CAM device according to a first embodiment is set forth in a block schematic diagram and designated by the general reference character 100. A CAM device 100 can preferably be formed on a single substrate, such as a semiconductor substrate, as an integrated circuit device. A CAM device 100 can receive a compare data value (e.g., search key or comparand value) CMP for comparison with a number of stored data values.

CAM device 100 can include a number of different blocks, each of which can store a different portion of the stored data values. In the particular example of FIG. 1, CAM device 100 includes CAM blocks A and B (102-0 and 102-1). Within CAM device 100 compare data value CMP can be split from a "native" size (e.g., a received bit width) into two or more smaller portions. In FIG. 1, compare data value CMP is internally split into two portions: CMP(part A) and CMP(part B).

Resulting compare data value portions, CMP(part A) and CMP(part B), can be applied to corresponding CAM blocks (102-0 and 102-1). Thus, in the example of FIG. 1, CMP (part A) can be applied to CAM block A 102-0 while CMP(part B) can be applied to CAM block B 102-1. As will be described in more detail with reference to FIGS. 2A and 2B, the application of comparand value portions can be temporally staggered. Further, the activation of various portions of one CAM block can be conditioned on compare results provided by a preceding CAM block. Thus, in FIG. 1, activation of CAM block B 102-1 can be conditioned on compare results 104 generated by CAM block A 102-0.

Figure 2A:
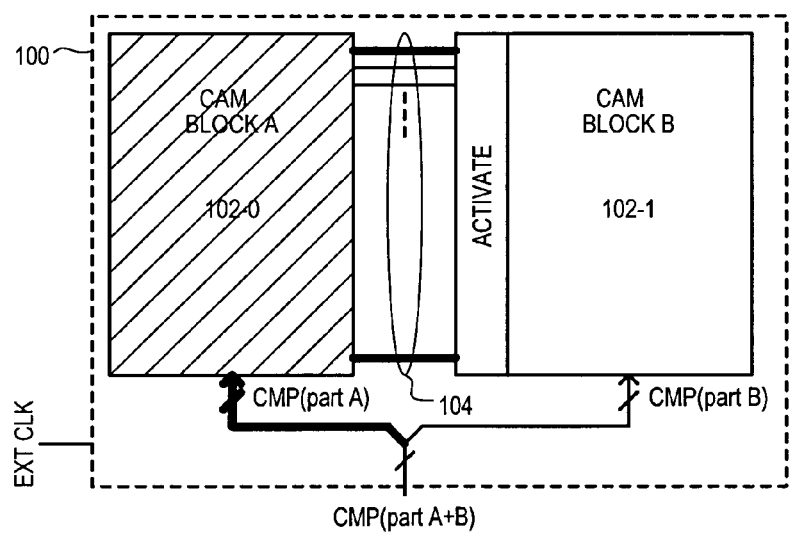
FIGS. 2A and 2B are block schematic diagrams showing the operation of the embodiment set forth in FIG. 1.
Figure 2B:
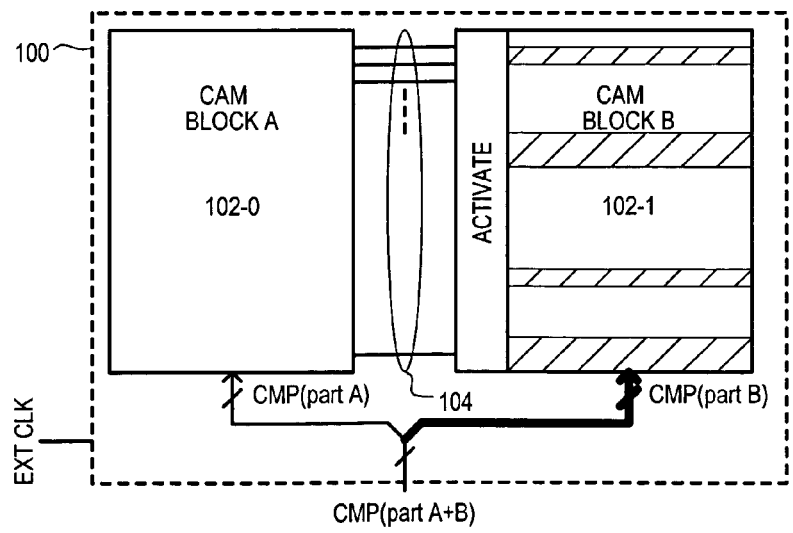

Referring now to FIGS. 2A and 2B, the operation of the embodiment of FIG. 1 will be described in more detail. FIGS. 2A and 2B represent a staggering of a compare operation into two portions over time (e.g., temporal staggering).

Referring to FIG. 2A, in a first part of a staggered compare operation, CAM block A 102-0 can be activated (represented by hatching), and a first comparand value portion CMP(part A) can be applied to CAM block A 102-0. Such a partial compare operation generates compare results 104 that can vary according to the stored data value portions in CAM block A 102-0. That is, some compare results can indicate MISS (no match between CMP(part A) and a stored data value portion), while others can indicate a HIT (match between CMP(part A) and stored data value portion). In most typical CAM applications, MISS results will predominate over HIT results.

Referring to FIG. 2B, in a subsequent part of the staggered compare operation, portions of CAM block B 102-1 can be selectively activated (represented by hatching) based on compare results 104 generated by CAM block A 102-0. That is, activation of various portions of CAM block B 102-1 can be conditioned on match results from CAM block A 102-0. Such selective activation can be based on the type of CAM device architecture. Two possible architecture examples will now be described.

In a "miss-sensing" architecture, CAM block A 102-0 can be preset to indicate a HIT for all compare results 104. When CMP(part A) is applied to CAM block A 102-0, compare results 104 for stored data value portions that do not match CMP(part A) will switch to indicate a MISS. Such MISS results can be used to prevent corresponding portions of CAM block B 102-1 from being preset to the HIT state.

Conversely, in a "hit-sensing" architecture, CAM block A 102-0 can be preset to indicate a MISS for all compare results 104. When CMP(part A) is applied to CAM block A 102-0, compare results 104 for stored data value portions that match CMP(part A) will switch to indicate a HIT. Such HIT results can be used to enable corresponding portions of CAM block B 102-1 to be preset to the MISS state.

Presetting CAM blocks to initial values, and switching compare results in response to compare data values can draw current and hence consume power. As represented by variations in hatching between FIGS. 2A and 2B, power can be conserved, as only a portion of the CAM device is activated at a given time as opposed to an entire block being activated, as in a conventional case such as that shown in FIG. 15. In particular, CAM block A 102-0 can be activated in a first part of a staggered compare operation, and only selected portions of CAM block B 102-1 can be activated in a subsequent part of the staggered compare operation.

Figure 3:
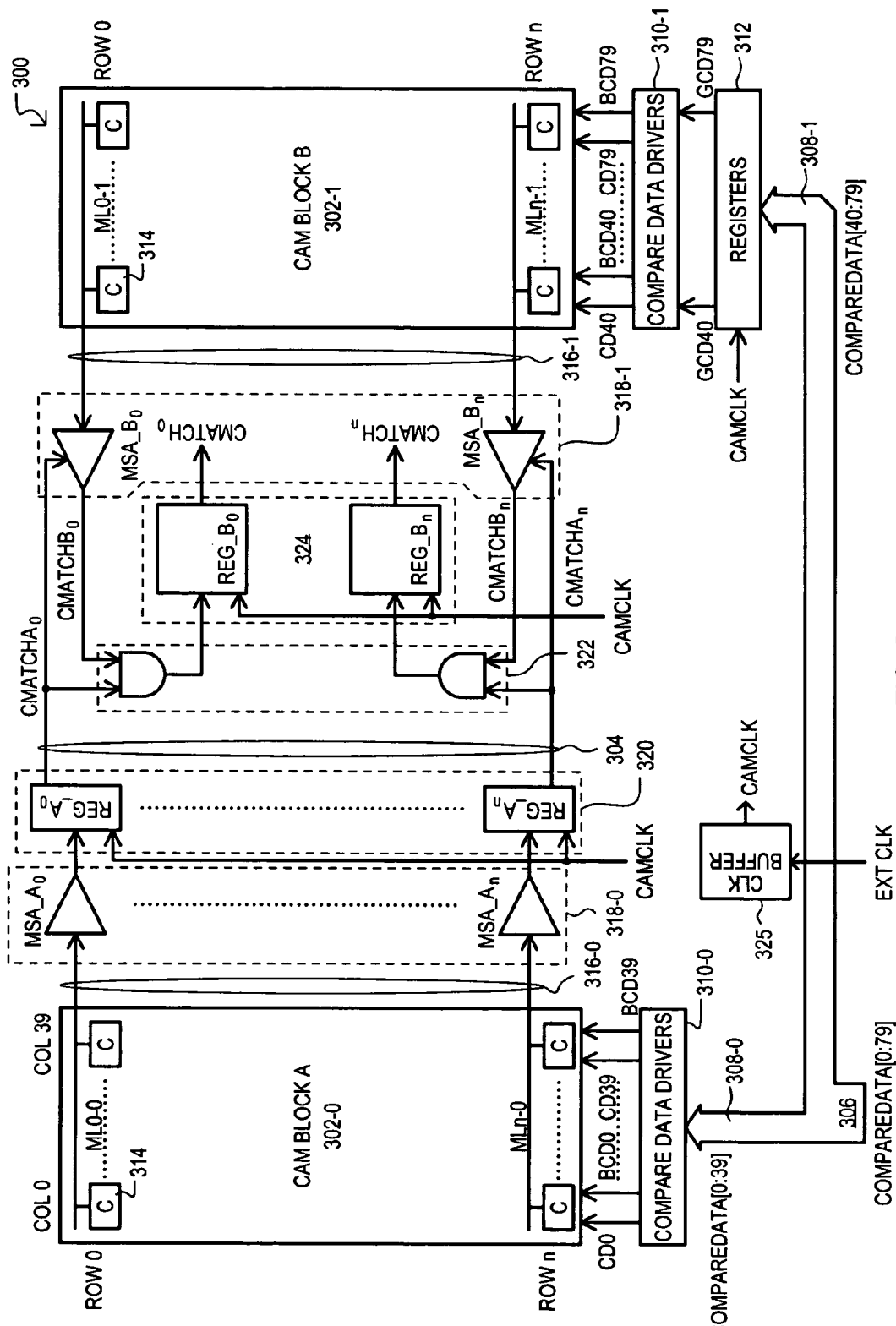
FIG. 3 is block schematic diagram of a CAM device according to a second embodiment.

Referring now to FIG. 3, a second embodiment of the present invention is set forth in block schematic diagram and designated by the general reference character 300. A CAM device 300 can include some of the same general constituents as the first embodiment, including a first CAM block A 302-0 and a second CAM block B 302-1, and first match results 304 provided from CAM block A 302-0 to CAM block B 302-1.

CAM device 300 can further include a compare data bus 306 that can receive a compare data value. In the particular example of FIG. 3, a compare data value can have a native word size of 80-bits COMPAREDATA[0:79]. That is, CAM device 300 can receive all 80 bits in parallel. Compare data bus 306 can be a split bus, having a first bus portion 308-0 and a second bus portion 308-1. A first bus portion 308-0 can provide a first portion of a compare data value to CAM block A 302-0, while a second bus portion 308-1 can provide a second portion of a compare data value to CAM block B 302-1. Compare data value portions provided to different CAM blocks can be smaller than a native word size. Thus in FIG. 3, a first compare data portion COMPAREDATA[0:39] can be a 40 bit value, while a second compare data portion COMPAREDATA[40:79] can also be a 40 bit value.

It is understood that while FIG. 3 shows an example in which a compare data value has been split into equal portions, such an arrangement should not be construed as limiting the invention thereto. In alternate arrangements, a CAM device according to the invention could split compare data values into two or more portions of unequal size, all portions being smaller than the native word size.

The various compare data value portions can be applied to different CAM blocks 302-0 and 302-1 by compare data driver circuits 310-0 and 310-1, respectively. In the arrangement shown, such compare data can be applied as complementary value pairs CD0/BCD0 to CD79/BCD79. However, it is understood that compare data values could be applied as single bit values assuming CAM cells of appropriate structure.

In FIG. 3, temporal staggering of compare operations can accomplished by applying COMPAREDATA[40:79] to CAM block B 302-1 after applying COMPAREDATA[0:39] to CAM block A 302-0. In particular, COMPAREDATA[40:79] can be received by register circuit 312. Register circuit 312 can output COMPAREDATA[40:79] as compare data values GCD40 to GCD79 in response to a clock signal CAMCLK. A clock signal CAMCLK can be synchronous with an external clock EXT CLK applied to CAM device 300. In this way, COMPAREDATA[40:79] can be applied one CAMCLK clock cycle after COMPAREDATA[0:39]. Of course, alternate embodiments could provide different and/or longer delays between the application of compare data value portions.

In FIG. 3, each CAM block (302-0 and 302-1) can include a number of CAM cells, one of which is shown as 314, arranged into rows ROW 0 to ROW n. Within each CAM block (302-0 and 302-1), CAM cells of the same row can be commonly coupled to a match line. Thus, in CAM block A 302-O, CAM cells of rows ROW 0 to ROW n can be coupled to match lines ML0-0 to MLn-0, respectively. Similarly, in CAM block B 302-1, CAM cells of rows ROW 0 to ROW n can be coupled to match lines ML0-1 to MLn-1, respectively.

Match lines (ML0-0 to MLn-1) can provide match indications for their respective row. Match indications may indicate a HIT or MISS between a data value portion stored in the row, and the applied compare data value portion. Match lines of CAM block A 302-0 can provide first match indications 316-0, which can be sensed by first sense amplifiers (MSA_$A_0$ to MSA_$A_n$) 318-0. In a similar fashion, match lines of CAM block B 302-1 can provide second match indications 316-1, which can be sensed by second sense amplifiers (MSA_$B_0$ to MSA_$B_n$) 318-1.

Outputs from first sense amplifiers 318-0 can be received by corresponding first result registers (REG_$A_0$ to REG_$A_n$) 320. In response to a CAMCLK signal, first result registers 320 can provide first result outputs CMATCHA$_0$ to CMATCHA$_n$. First result outputs (CMATCHA$_0$ to CMATCHA$_n$) can represent match results between stored data value portions of CAM block A 302-0 and COMPAREDATA[0:39]. Second sense amplifiers 318-1 can provide second result outputs CMATCHB$_0$ to CMATCHB$_n$. Second result outputs (CMATCHB$_0$ to CMATCHB$_n$) can represent match results between partial stored data values of CAM block B 302-1 and COMPAREDATA[40:79]. However, the values of second result outputs (CMATCHB$_0$ to CMATCHB$_n$) are also conditioned on first result outputs (CMATCHA$_0$ to CMATCHA$_n$).

Each first result output (CMATCHA$_0$ to CMATCHA$_n$) can be logically combined with a corresponding second result output (CMATCHB$_0$ to CMATCHB$_n$) to generate match results. Such match results provided by match result registers 324 as match results (CMATCH$_0$ to CMATCH$_n$).

For example, in FIG. 3, first result output CMATCHA$_0$ can be logically combined with corresponding second result output CMATCHB$_0$ to generate a result output from register REG_B$_0$ as CMATCH$_0$. In the particular example of FIG. 3, such logical combination is accomplished by combine circuit 322 which can logically AND corresponding result outputs to thereby generate match results. Match results can be stored within match result registers (REG_B$_0$ to REG_B$_n$) 324 and output as signals CMATCH$_0$ to CMATCH$_n$ in response to the CAMCLK signal.

A CAM device 300 can generate a CAMCLK signal based on externally applied clock signal EXT CLK. In the particular example of FIG. 3, a CAMCLK signal can be generated by a clock buffer circuit 325. It is understood that such a clock buffer circuit 325 could include other circuits such a delay lock loop (DLL) or phase lock loop circuit (PLL).

Figure 4:
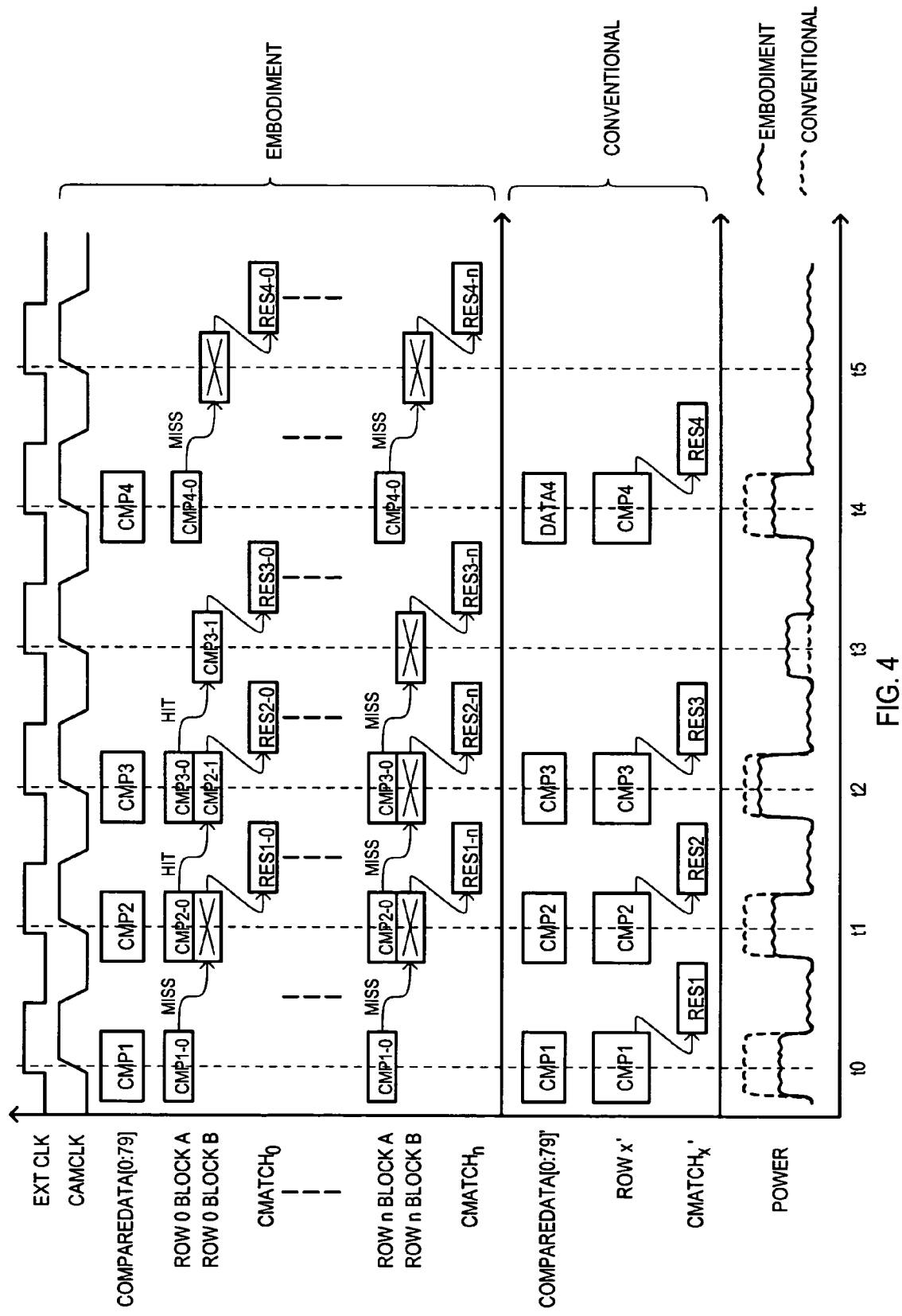
FIG. 4 is a timing diagram showing the operation of the second embodiment as compared with the conventional example shown in FIG. 15.

The operation of the second embodiment will now be described with reference to FIG. 4. FIG. 4 is a timing diagram illustrating a staggered compare operation of CAM device 300 as compared to the conventional example shown in FIG. 15.

In FIG. 4, waveform EXT CLK can be an external clock signal applied to CAM device. Waveform CAMCLK can be an internal clock signal generated from the EXT CLK signal. More particularly, a CAMCLK signal can be in synchronism with an EXT CLK signal.

Waveform COMPAREDATA[0:79] can represent compare data applied to CAM device 300. Corresponding CAM rows for CAM blocks (302-0 and 302-1) are represented by waveforms ROW x BLOCK A and ROW x BLOCK B, where x is a row number from 0 to n. A match result for such corresponding CAM rows is given by CMATCHx.

The operation of conventional CAM device 1500 is illustrated by waveform COMPAREDATA[0:79]', which represents an applied compare data value. One row of conventional CAM device 1500 is shown by ROWx', while a corresponding match result is shown by CMATCHx'.

Waveform POWER of FIG. 4 includes two waveforms projected on one another, one representing power consumed by a CAM device 300 according to a second embodiment (shown by a solid line) and the other representing power consumed by conventional CAM device 1500 (shown by a dashed line).

The operation of a second embodiment will now be described with reference to FIG. 3 in conjunction with FIG. 4. It will be assumed that CAM device 300 has a "miss-sense" architecture. However, as would be understood by one skilled in the art, the description is equally applicable to a hit-sensing architecture.

At time t0, a compare data value CMP1 can be received by CAM device 300. The native word size for value CMP1 can be split into multiple portions. One portion can be applied to the rows of CAM block A 302-0, while another portion can be stored in register circuit 312, for output on a subsequent clock cycle. The compare operation of a first compare data portion is shown in FIG. 4 by "CMP1-0". Thus, within CAM block A 302-0, COMPAREDATA[0:39] can be compared in ROW 0 BLOCK A through ROW n BLOCK A.

In the example of FIG. 4, compare results for ROWS 0 through n of CAM block A 302-0 are MISSes. Accordingly, referring back to FIG. 3, match sense amplifier MSA_$A_0$ can output a miss indication, which can be stored in first result register REG_$A_0$. Such a value can be provided as signal CMATCHA$_0$ in a next CAMCLK cycle to second sense amplifier MSA_$B_0$. In the same way, first result register REG_A$_n$ can provide signal CMATCH$_n$ as a miss indication to second sense amplifier MSA_B$_n$ in a next CAMCLK cycle.

In the conventional example, at time t0, compare data value CMP1 is applied to a CAM block having rows of the native width size. Such a compare operation can generate a conventional result RES1.

As shown by the POWER waveform, in the conventional case, an entire compare data value is applied to CAM block having a native word size. In contrast, in the second embodiment, because only a portion of a compare data value (CMP1-0) is applied to a CAM block having a width smaller than a native word size, the power consumed can be considerably less.

At time t1, the CAM device 300 can complete the compare operation for compare data value CMP1. In particular, a second portion of compare data value CMP1 can be applied to CAM block B 302-1 by register circuit 312. However, as described above, compare operations within CAM block B 302-1 can be conditioned on corresponding results from CAM block A 302-0. Thus, when signals CMATCHA$_0$ to CMATCHA$_n$ are output from first result registers, those indicating a MISS result will disable the corresponding second match sense amplifiers MSA_B$_0$ to MSA_B$_n$. Because MISS results can predominate in a typical application, the majority of second match sense amplifiers will be disabled, consuming considerably less power than CAM block A 302-0 in the previous CAMCLK cycle.

Following the compare operation within CAM block B 302-1, first result outputs (CMATCHA$_0$ to CMATCHA$_n$) from first result registers 320 can be logically combined with second result outputs (CMATCHA$_0$ to CMATCHA$_n$) by combine circuit 322 to generate match results CMATCHA$_0$ to CMATCH$_n$. Such match results are represented by (RES1-0 to RES1-$n$) in FIG. 4.

Also at time t1, a second compare data value CMP2 can be received by CAM device 300. As in the case of the previous compare data value CMP1, the native word size for value CMP2 can be split into multiple portions, with one portion being applied to CAM block A 302-0 at about time t1, while another portion is stored in register circuit 312 for application to CAM block B 302-1 at about time t2.

It is noted that in FIG. 4, compare operations in CAM block B 302-1 are deferred by one CAMCLK cycle. Thus, CAM device 300 can produce a match result with greater latency than the conventional case. However, as shown in FIG. 4, overall throughput can be the same as the conventional case, with match result being provided each CAMCLK cycle.

Operations can continue as illustrated in FIG. 4. It is noted that FIG. 4 shows a "HIT" result for ROW 0 BLOCK A at time t1. Thus, compare operations still occur for corresponding ROW 0 BLOCK B at time t2. However, as noted above, because MISS results typically predominate, power continues to be conserved as the majority (e.g., nearly all) of the rows in CAM block B 302-1 will not undertake a compare operation.

Figure 5:
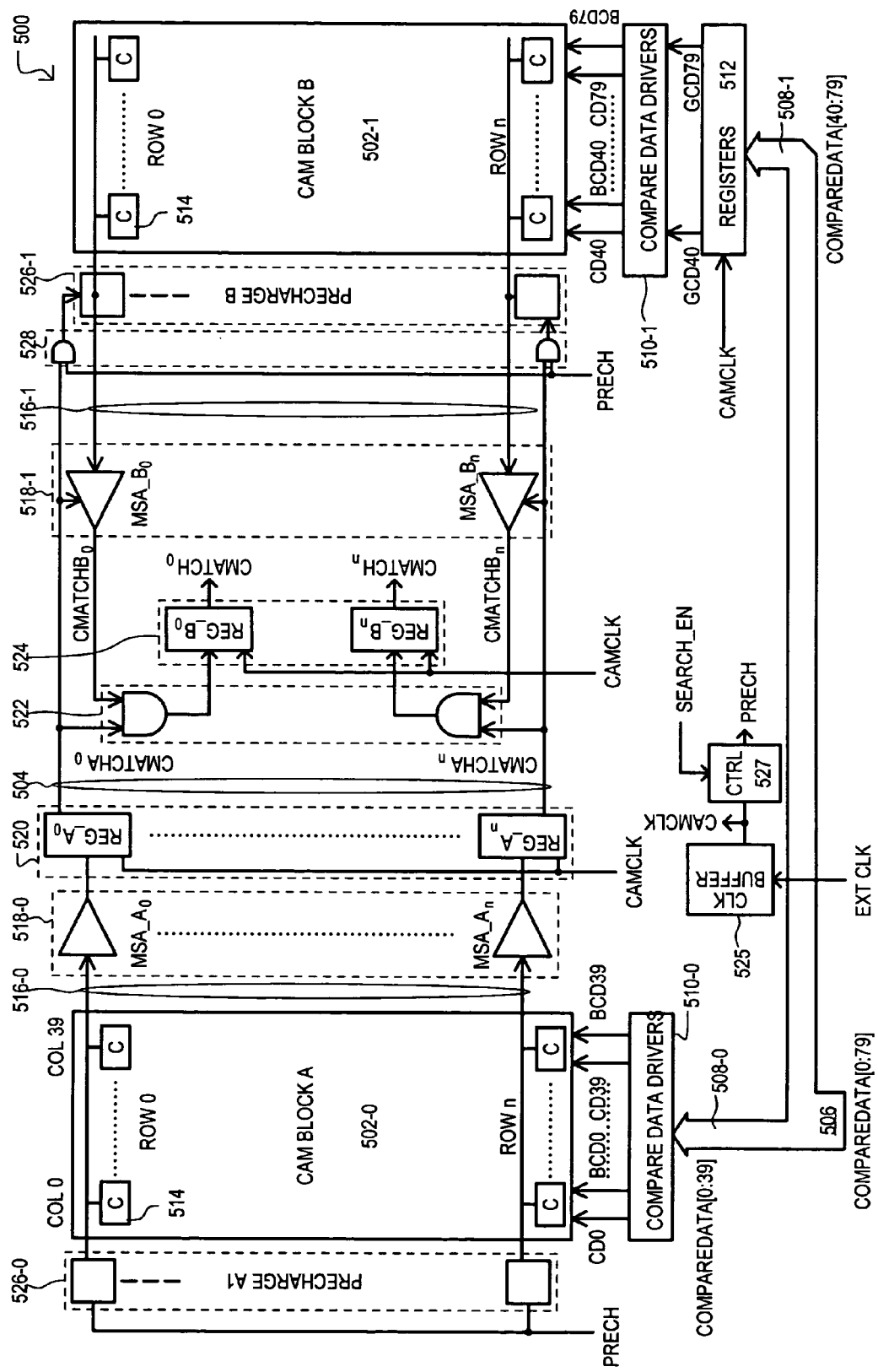
FIG. 5 is block schematic diagram of a CAM device according to a third embodiment.

Referring now to FIG. 5, a third embodiment of the present invention is set forth in block schematic diagram and designated by the general reference character 500. A CAM device 500 can include the same general components as the second embodiment. Accordingly, like components will be referred to by the same reference character but with the first digit being a "5" instead of a "3". Also, a description of such components will be omitted.

FIG. 5 differs from FIG. 3 in that CAM device 500 further shows first precharge circuits 526-0, each coupled to a corresponding first match line of CAM array A 502-0, and second precharge circuits 526-1, each coupled to second match lines of CAM array B 502-1. First precharge circuits 526-0 can be enabled by a precharge signal PRECH provided by control circuit 527. A precharge signal PRECH can be active provided a search enable signal SEARCH_EN is active. In one particular arrangement, a precharge signal may have a duration of about ½ a CAMCLK cycle, and can correspond to a high CAMCLK half cycle.

When enabled, first precharge circuits 526-0 can set match lines of CAM block A 502-0 to a predetermined potential (e.g., a high precharge potential). Subsequently, according to match results, match lines may be switched to a different potential (e.g., discharged low in the event of a MISS). Unlike the first precharge circuits 526-0, second precharge circuits 526-1 can be enabled by a logical ANDing of signal PRECH and the corresponding first match result (CMATCHA$_0$ to CMATCHA$_n$). Thus, a precharging of match line in CAM block B 502-1 can be conditioned on corresponding match results from CAM array A 502-0. This, in combination with conditional sense amplifier enabling, can provide considerable power savings.

As but one very particular example of power savings that can occur in a CAM device according to the present invention, a compare operation can consume about 40% of the total power of a CAM array (e.g., all CAM blocks of a CAM device). However, in the third embodiment, assuming that a compare data value is split in half, a resulting compare operation consumes half the power. Further, assuming that the operation of splitting the native word adds an additional 10% power drain, such a second embodiment may provide a 16% reduction in overall power consumption.

Figures 6A, 6B:
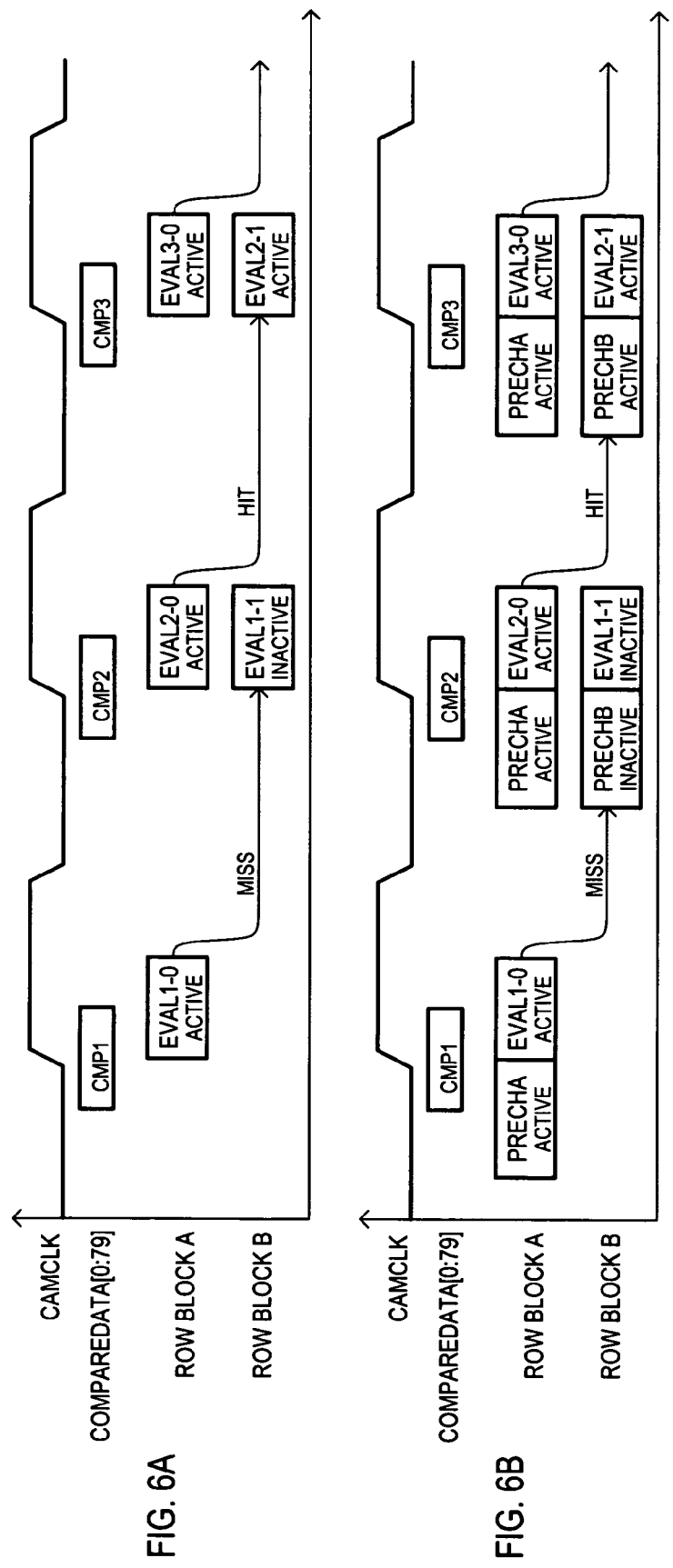
FIGS. 6A and 6B are timing diagrams showing variations in power savings according to embodiments of the present invention.

Thus, the various embodiments of the present invention can provide a number of ways for reducing power consumption. Selected examples of such various power saving features will now be described with reference to FIGS. 6A and 6B. FIGS. 6A and 6B each show a "CAMCLK" signal, an applied compare data value "COMPARE[0:79]", a sample row from a first CAM block "ROW A", and the corresponding row of a second CAM block "ROW B".

FIG. 6A is a timing diagram that can correspond to the embodiment of FIG. 3. Evaluation (e.g., activation of sense amplifiers) in one CAM block (ROW BLOCK B) can be conditioned on a HIT occurring from evaluation in a previous CAM block (ROW BLOCK A).

FIG. 6B is a timing diagram that can correspond to the embodiment of FIG. 5. Evaluation and precharge within one CAM block (ROW BLOCK B) can be conditioned on a HIT or MISS occurring from evaluation in a previous CAM block (ROW BLOCK A).

It is noted that while the embodiments described above have shown conditional activation on a row-by-row basis, power saving like those of FIGS. 6A and 6B can occur according to corresponding row groups. A first example of such an arrangement in shown in FIG. 7 as a fourth embodiment.

Figure 7:
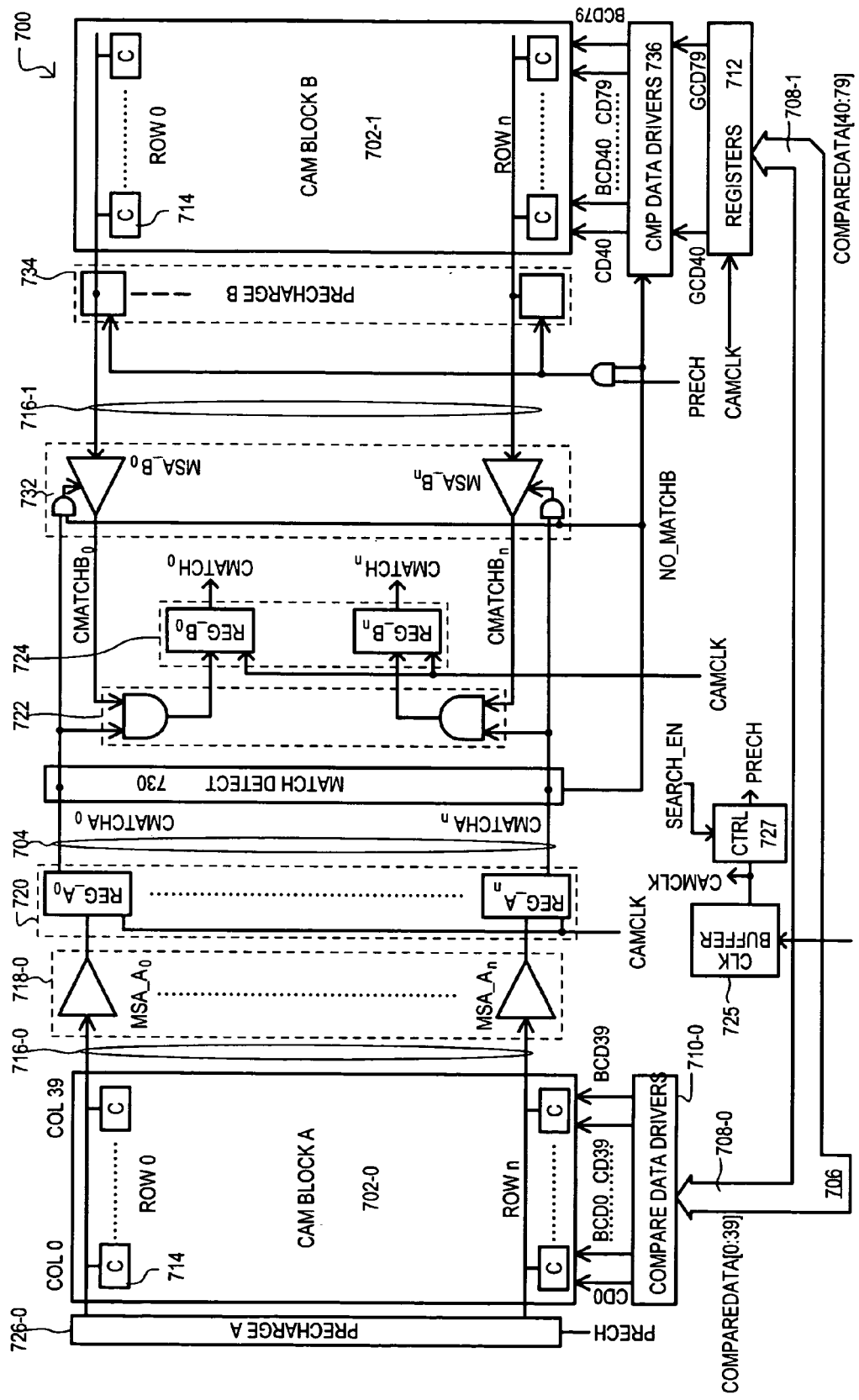
FIG. 7 is a block schematic diagram of a CAM device according to a fourth embodiment.

FIG. 7 shows a CAM device 700 that can include the same general components as the third embodiment. Accordingly, like components will be referred to by the same reference character but with the first digit being a "7" instead of a "5", and a description of such components is omitted.

The embodiment of FIG. 7 differs from FIG. 5 in that CAM device 700 further includes a multiple match detect circuit 730. While a multiple match detect circuit 730 can typically be included to detect the presence of multiple match (HIT) results, such a circuit can also be used to determine when no match occurs. Thus, multiple match detect circuit 730 can activate a NO_MATCHB indication when first match results (CMATCHA$_0$ to CMATCHA$_n$) all indicate a MISS.

In addition, in CAM device 700, second sense amplifiers (MSA_B$_0$ to MSA_B$_n$) 732 and second precharge circuits 734 can be commonly enabled according to a NO_MATCHB indication. More particularly, second sense amplifiers 732 can be enabled by the logical combination of the NO_MATCHB indication and a corresponding first match result (CMATCHA$_0$ to CMATCHA$_n$). Thus, compare operations of a group of CAM rows (in this case CAM block B 702-1) can be disabled when a corresponding group in another group of CAM rows (CAM block A 702-0) indicates all MISS results.

It is noted that while the example of FIG. 7 can provide for group disabling of sense amplifier and precharge circuits, the CAM device 700 can also provide the row-wise disabling discussed in conjunction with FIGS. 3 and 5. CAM device 700 also shows how second compare data drivers 736 can also be disabled according to the NO_MATCHB signal. This can provide further reductions in power as the driving of compared data lines CD40/BCD40 to CD79/BCD79 can consume considerable power.

While the various embodiments can provide power savings over conventional arrangements, the present invention can also provide advantageous reductions in a power supply transient current. Such a result is illustrated in FIG. 8.

Figure 8:
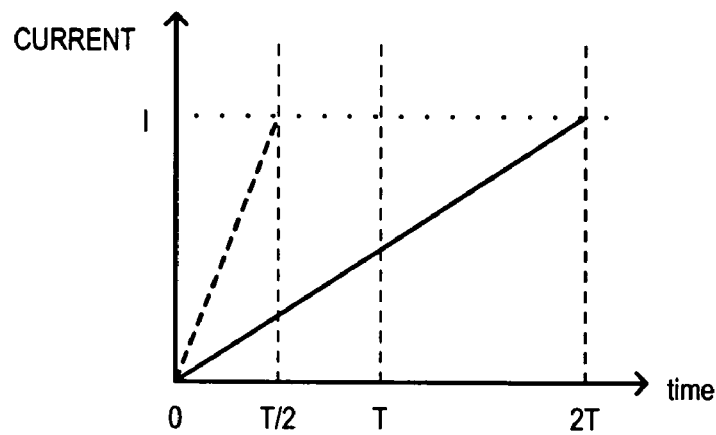
FIG. 8 is a timing diagram showing a transient current response according to the conventional device of FIG. 15 as compared to embodiments of the present invention.
Figure 15:
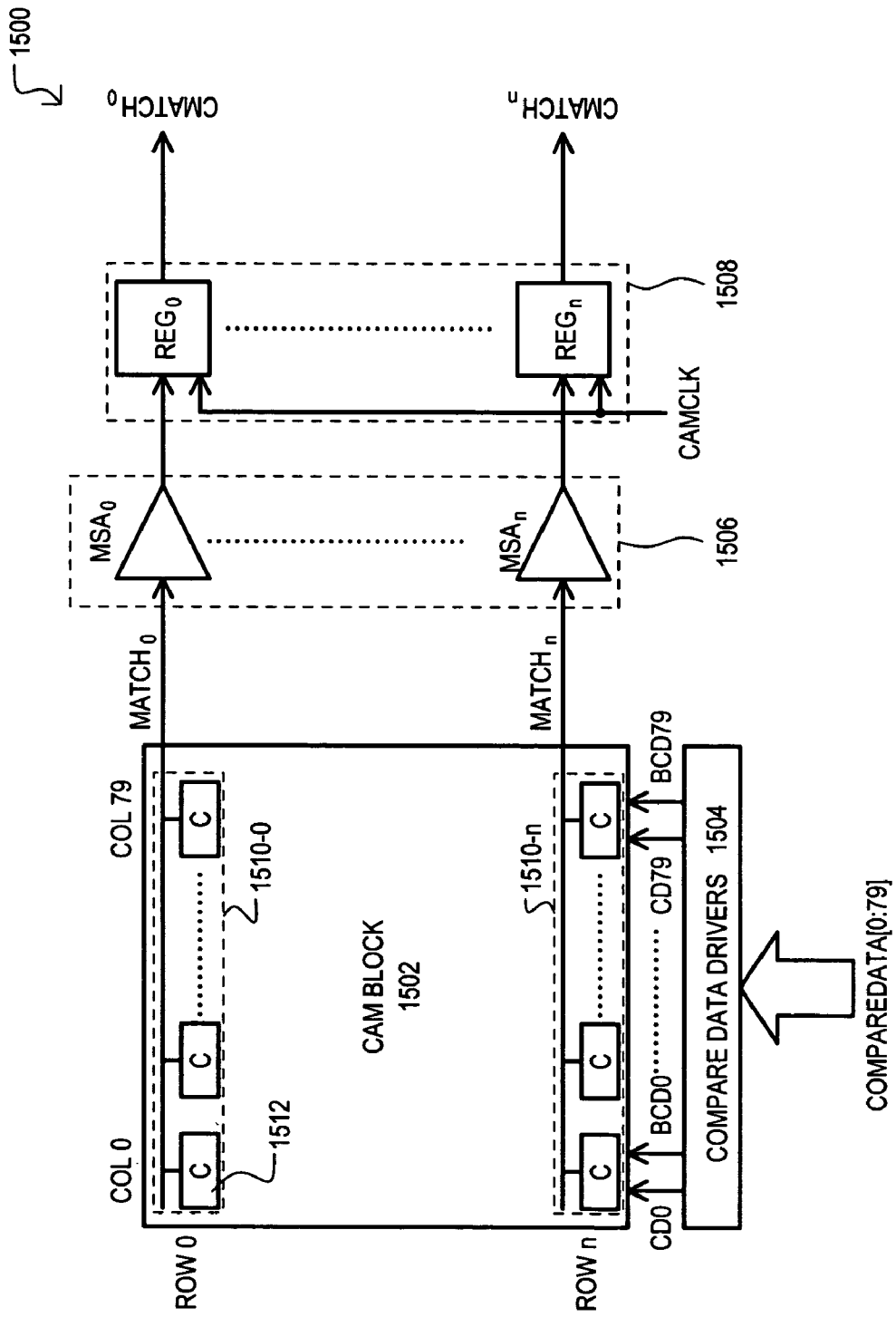
FIG. 15 is a block schematic diagram of a conventional CAM device.

FIG. 8 is a timing diagram showing the operation of a conventional CAM device like that of FIG. 15 as compared to embodiments of the present invention FIG. 8 shows a current versus time response.

As shown in FIG. 8, in the conventional case (shown by a dashed waveform), a switching current may be generally given by $I/(T/2)=2I/T$, where T is a CAMCLK cycle and the CAM device draws current of about I when all of the CAM array(s) is enabled, and such current is drawn in the time T/2. In the case of U.S. Pat. No. 6,240,000, noted above, assuming a same size CAM cell array, a switching current can be given by $I/T$. However, according to embodiments of the present invention, as shown by the solid waveform, a resulting current rate can be given as $I/(2T)$.

Of course, while the various embodiments have described a CAM device that delays activation of two different blocks by a clock cycle, alternate embodiment could include delays of longer duration. Along these same lines, while the above embodiments have split a native size word into two different portions, alternate arrangements could split a native word into a greater number of portions or unequal portions, resulting in a greater number of CAM blocks. As but one example, a CAM device could include four CAM blocks that sequentially compare different portions of the same native size word. Such an arrangement can result in an additional latency of three or more CAMCLK cycles.

It is also noted that the present invention can also include storing predetermined data value portions in that CAM block which performs a first evaluation. For example, data value portions that are most likely to result in a MISS (e.g., determined from probabilities of expected data values) could be applied to CAM block A 302-0. In this way, MISS indications could be maximized in CAM block A 302-0, thus maximizing the amount of power reduced during the activation of CAM block B 302-1.

Figure 9:
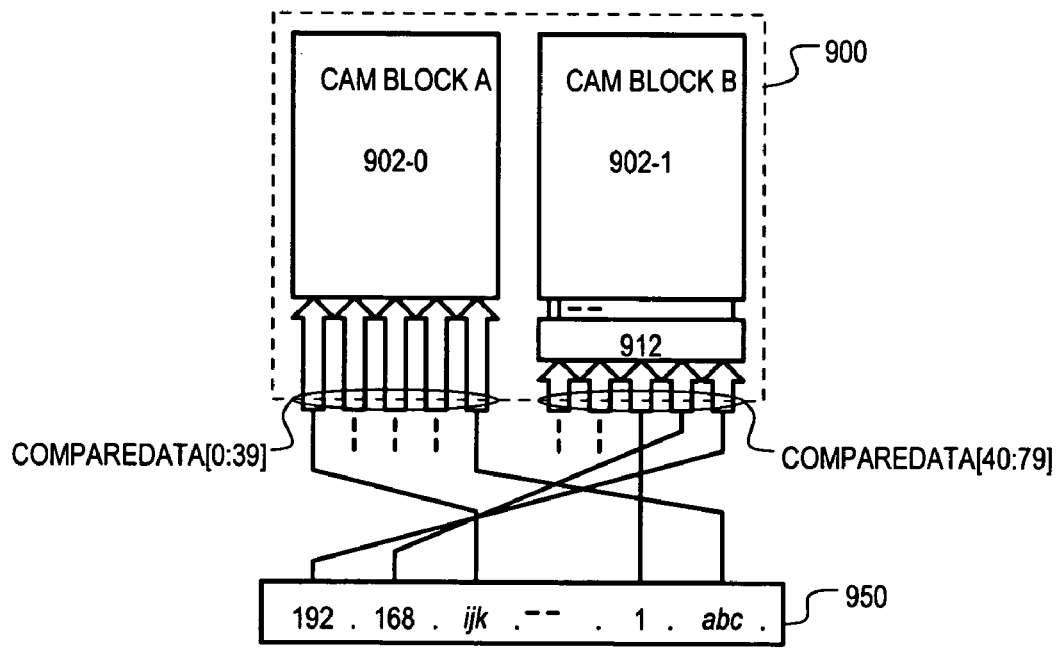
FIG. 9 is a block schematic diagram showing the application of search key values to a CAM device according to an embodiment.

A very particular example of such an application is set forth in FIG. 9. FIG. 9 shows a CAM device 900 having the same general configuration as that set forth in FIGS. 3, 5 and 7, including CAM block A 902-0, CAM block B 902-1, and register circuit 912. FIG. 9 also shows a search key 950. The particular search key can be broken into a number of octets (8 bit values). Those octets that are not expected to vary across search keys are shown with fixed numerical values (192, 168, 1). However, a search key 950 may also include fields that typically vary among search keys. Such fields are represented in FIG. 9 by octets having alphabetic values (ikj, abc).

In the example of FIG. 9, those portions of search key that are likely to vary and/or more likely to generate a MISS over stored entries, can be applied to CAM block A 902-0. Of course, data values stored within the CAM device would have to be written to the CAM entries in the same fashion. Such a selective application of search key portions can be accomplished by a processor, or the like.

Figure 10:
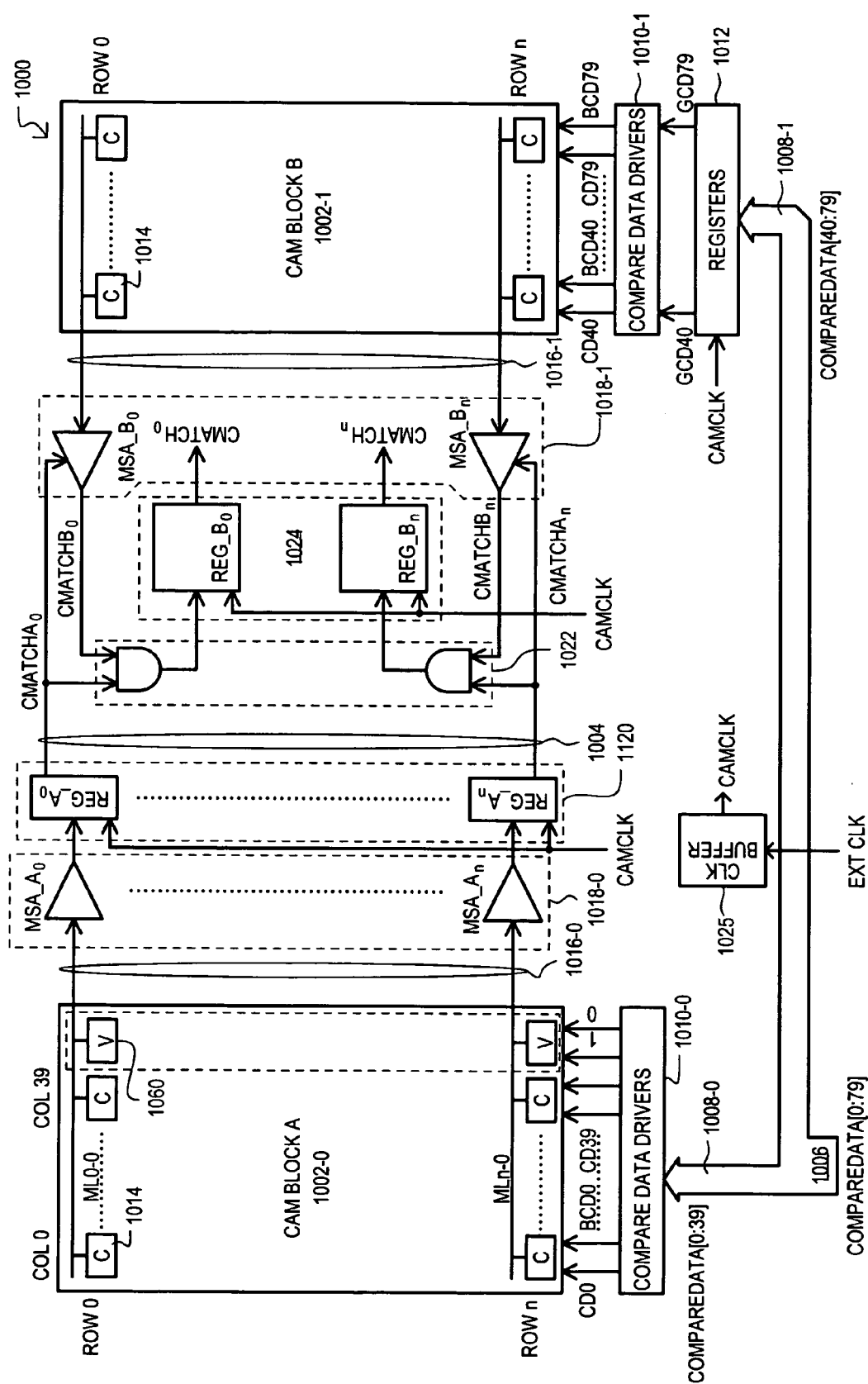
FIG. 10 is a block schematic diagram of a CAM device according to a fifth embodiment.

In addition, other CAM device features can be used to maximize MISS indications. One example is shown in FIG. 10. FIG. 10 has the same general components as the second embodiment. Accordingly, like components will be referred to by the same reference character but with the first digit being a "0" instead of a "3".

Unlike the third embodiment, CAM device 1000 of FIG. 10 shows "valid" bits (one of which is labeled as 1060) for the entries stored therein. A valid bit can indicate whether a given entry stores a valid data value or not. When an entry is not valid, a valid bit can force the corresponding match line to a MISS state. In this way, during a compare operation in CAM block A 1002-0, those rows having invalid entries will indicate a MISS, thereby disabling corresponding rows in CAM block B 1002-1.

Figure 11:
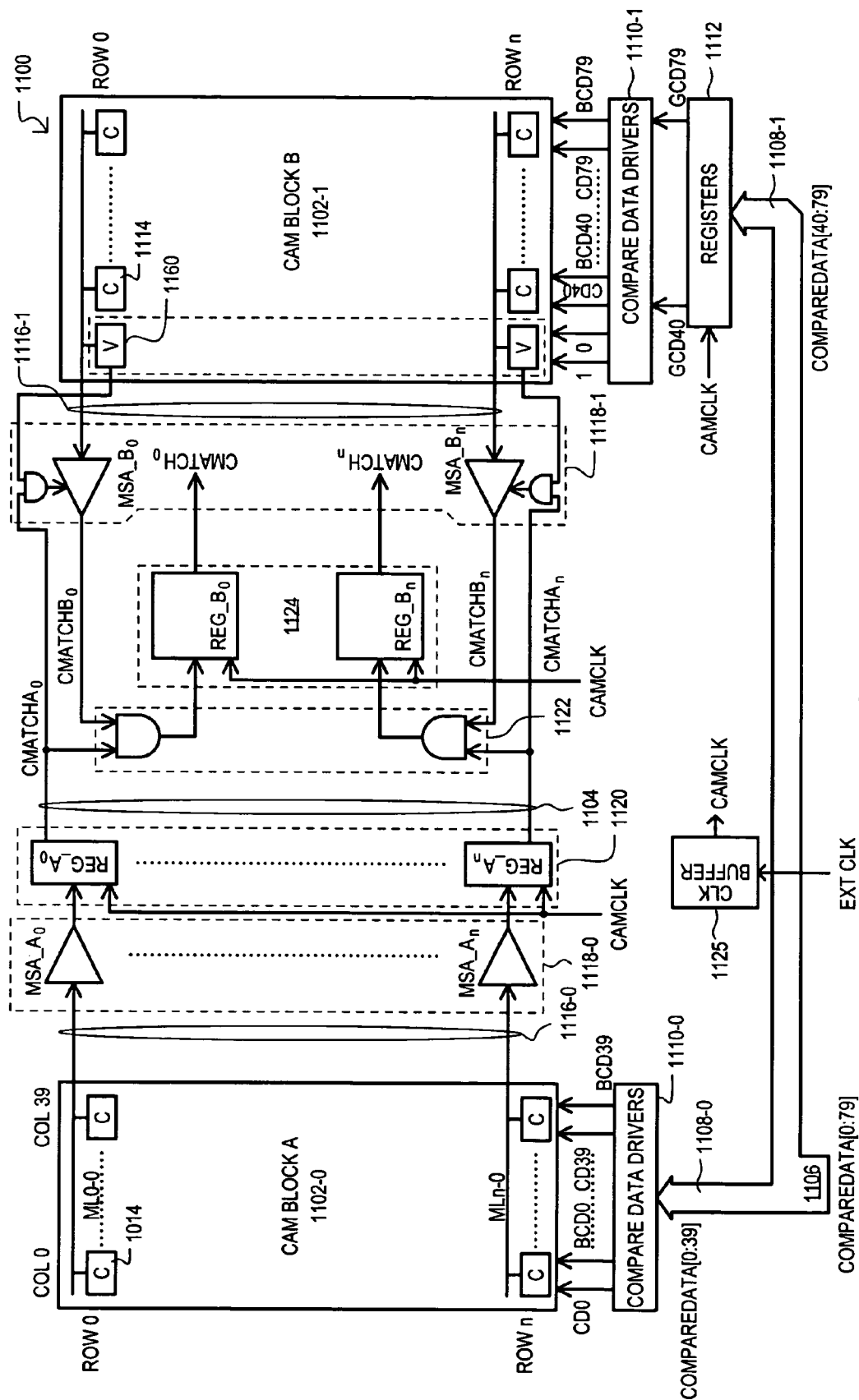
FIG. 11 is a block schematic diagram of a CAM device according to a sixth embodiment.

While one embodiment may include valid bits in a CAM block that is activated prior to other CAM blocks, alternate embodiments can condition activation for rows and/or groups of rows according to corresponding valid bits. One such approach is shown in FIG. 11. FIG. 11 has the same general components as the second embodiment. Accordingly, like components will be referred to by the same reference character but with the first digit being an "11" instead of a "3".

Unlike the embodiment of FIG. 10, in the CAM device 1100 valid bits are situated in a subsequently activated CAM block B 1102-1. Activation of second sense amplifiers 1138 can be conditioned on valid bit status. That is, if a valid bit indicates that a row does not correspond to a valid entry, the corresponding sense amplifier can be disabled.

Accordingly, the present invention can include various features for conditioning activation of CAM block circuits. Of course, the same features used to condition activation of sense amplifiers can be used to condition the activation of precharge circuits and/or compare data driver circuits as described in the various other embodiments.

Figure 12:
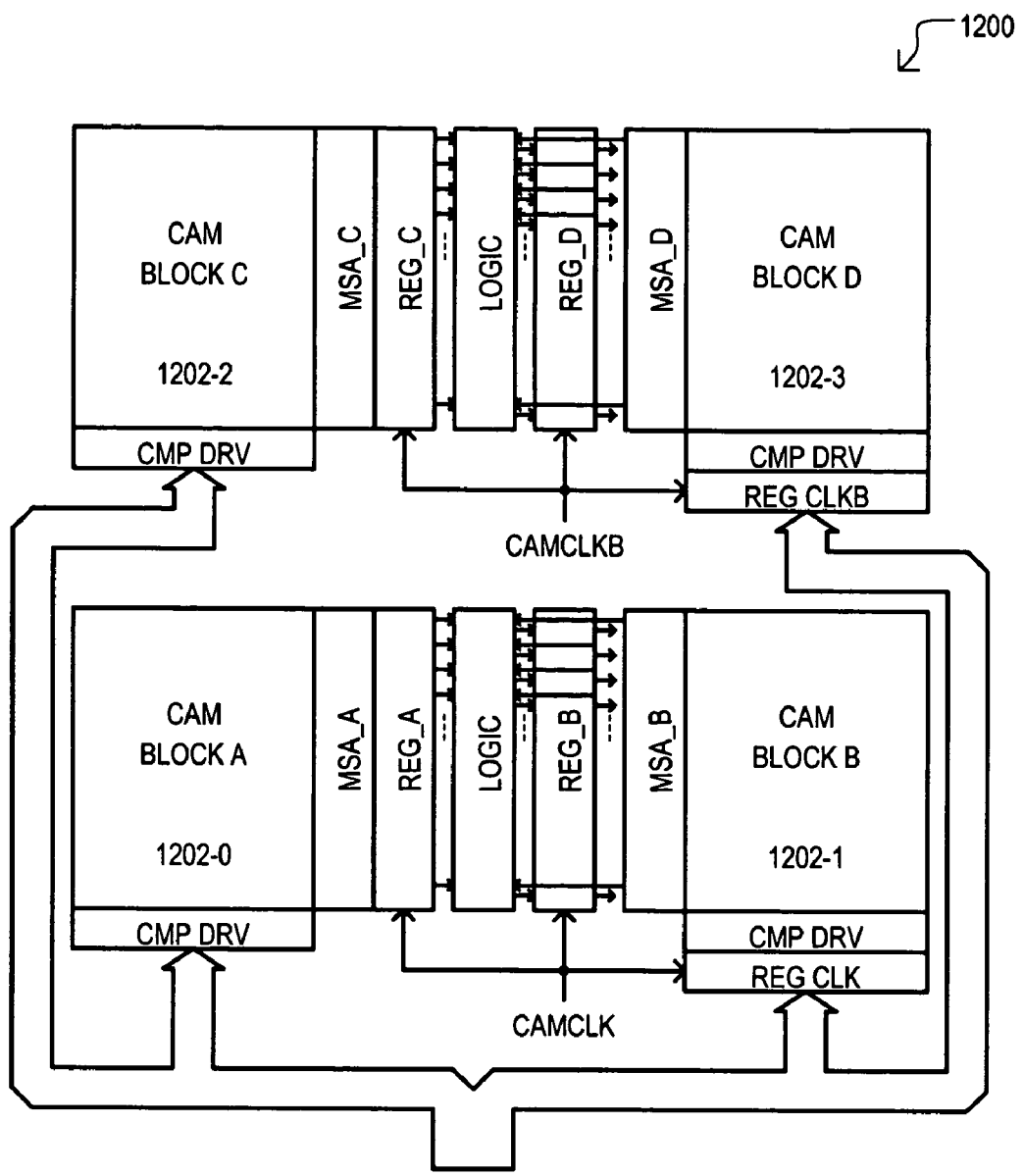
FIG. 12 is a block schematic diagram of a CAM device according to a seventh embodiment.

The above embodiments have illustrated CAM devices that can function at or in response to a rising or falling edge of a CAMCLK. However, the various features of the embodiments can be applied by having different blocks activated at or in response to rising and falling edges of a CAMCLK (providing for even greater smoothing of power supply transients than the single clock edge case). One particular example of such an architecture is set forth in FIG. 12 and designated by the general reference character 1200.

CAM device 1200 can include a CAM block A 1202-0 and a CAM block B 1202-1 that can operate in the same general fashion as described in the embodiments above. However, CAM device 1200 may also include CAM block C 1202-2 and CAM block D 1202-3. CAM block C 1202-2 can operate like CAM block A 1202-0, but can generate partial match results in response to a negative clock edge, as shown by the application of a CAMCLKB signal to the corresponding register circuit REG_C. Similarly, CAM block D 1202-3 can be conditionally activated on a subsequent negative clock edge, as shown by the application of CAMCLKB to register circuits REG CLKB and REG_D.

The present invention may also be conceptualized as a method of saving power in a CAM device. A first embodiment method is set forth in FIG. 13 and designated by the general reference character 1300. The method of FIG. 13 can include receiving a compare data value of N bits (step 1302). Such an N bit value can be considered a native word size for the compare data. A received compare data value can be split into multiple portions of less than N bits (step 1304). Such multiple portions may include two or more portions that may or may not be of the same bit size. However, such portions may all be smaller than a native word size.

Figure 13:
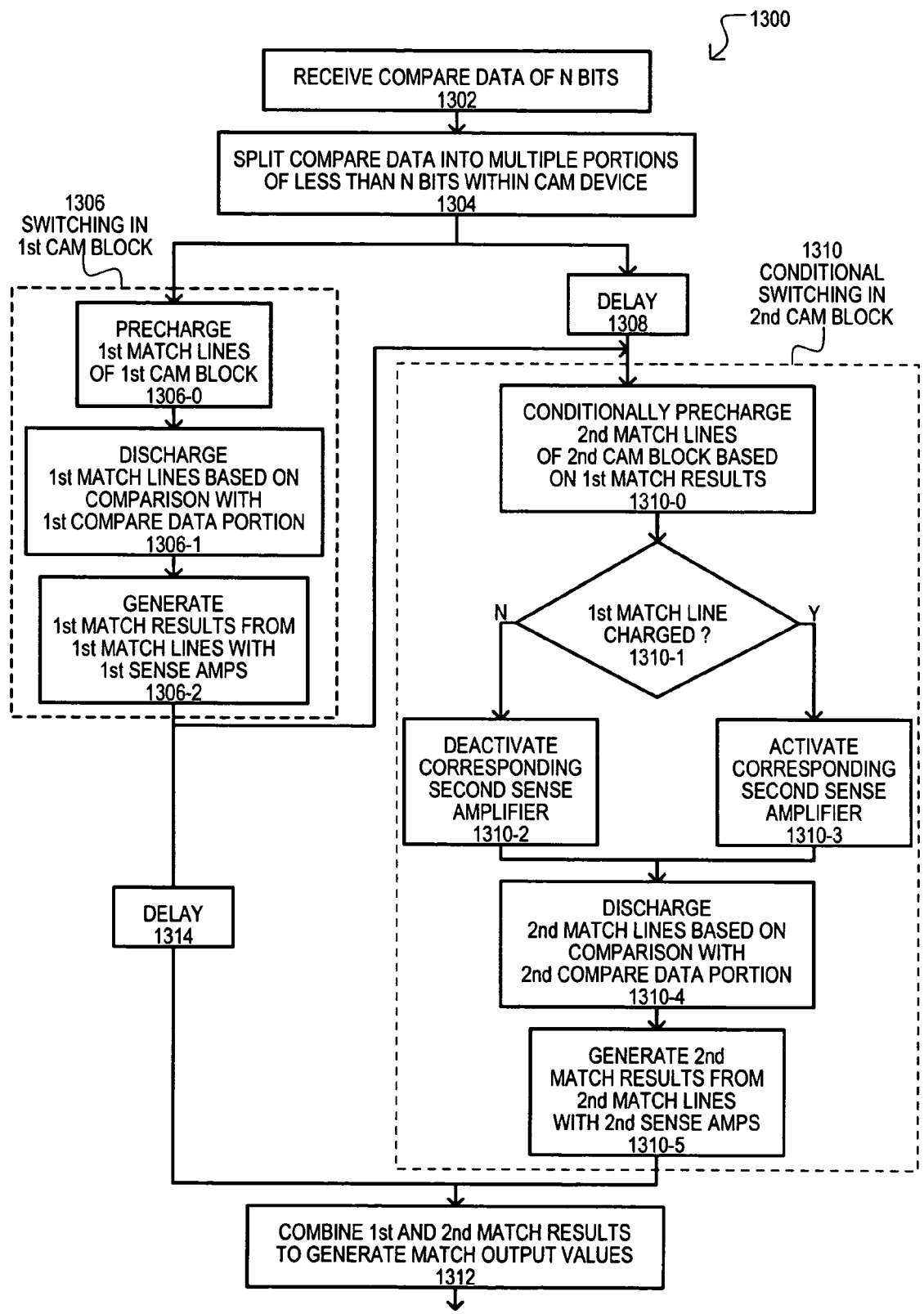
FIG. 13 is a flow diagram showing a CAM device power saving method according to one embodiment.

A method 1300 may further include switching in a first CAM block (step 1306). Such a step may include a number of sub-steps according to a particular architecture. In the example of FIG. 13, switching in a first block can include precharging first match lines of a first CAM block (step 1306-0). Such a step can set first match lines to a predetermined potential. It is understood that such a precharge step could precede the reception and/or splitting of the compare data (steps 1302 and 1304). Also, in other types of architecture such a step could include discharging match lines.

Previously precharged first match lines can be discharged based on a comparison with a first compare data portion (step 1306-1). As but one example, any CAM cell coupled to a match line that does not store the same bit value as an applied compare data value can enable a discharge path for the match line. First match results may then be generated from first match lines with first sense amplifiers (step 1306-2). As but one example, such a step can include providing a low logic value for discharged match lines, and a high logic value for any match lines that remain precharged. Such high and low logic values can distinguish a HIT result from a MISS result.

A method 1300 may then include a delay 1308. As noted above, such a delay can reduce power supply transients by deferring compare operations in a second CAM block until a later time. Such a delay can be based on positive and/or negative clock edges, as but two very particular examples.

A method may then proceed to conditional switching in a second CAM block (step 1310). In the example of FIG. 13, such conditional switching can include conditionally precharging second match lines of a second CAM block based on first match results (step 1310-0). For example, second match lines may only be precharged if the corresponding first match result indicates a HIT. Such a feature can conserve power, particularly in those applications where MISS results predominate. Further, because such conditional switching in a second CAM block can be based on first match results, such actions can follow step 1306-2.

FIG. 13 also shows the conditional activation of second sense amplifiers based on first match results. Such a step can include determining if a 1$^{st}$ match line is charged (step 1310-1), and deactivating a corresponding sense amplifier if the 1$^{st}$ match line is not charged (indicates a MISS) (1310-2) and activating a corresponding sense amplifier if the 1$^{st}$ match line is charged (indicates a HIT) (1310-3). This may also further conserve power.

Having conditionally activated portions of a second CAM block, a method may then discharge second match lines based on comparisons with a second data portion (step 1310-4). This step can consume less power than a step 1306-1, as only selected second match lines will have been precharged. Second match results may then be generated by second sense amplifiers (step 1310-5). This step can also consume less power than a step 1306-2, as only selected second sense amplifiers will have been enabled.

First and second match results can then be combined to generate match output values (step 1312). Because the generation of first match results can precede the generation of second match results, FIG. 13 shows a delay 1314 after step 1306-2, which can serve to ensure that each second match result is combined with the appropriate first match result.

Figure 14:
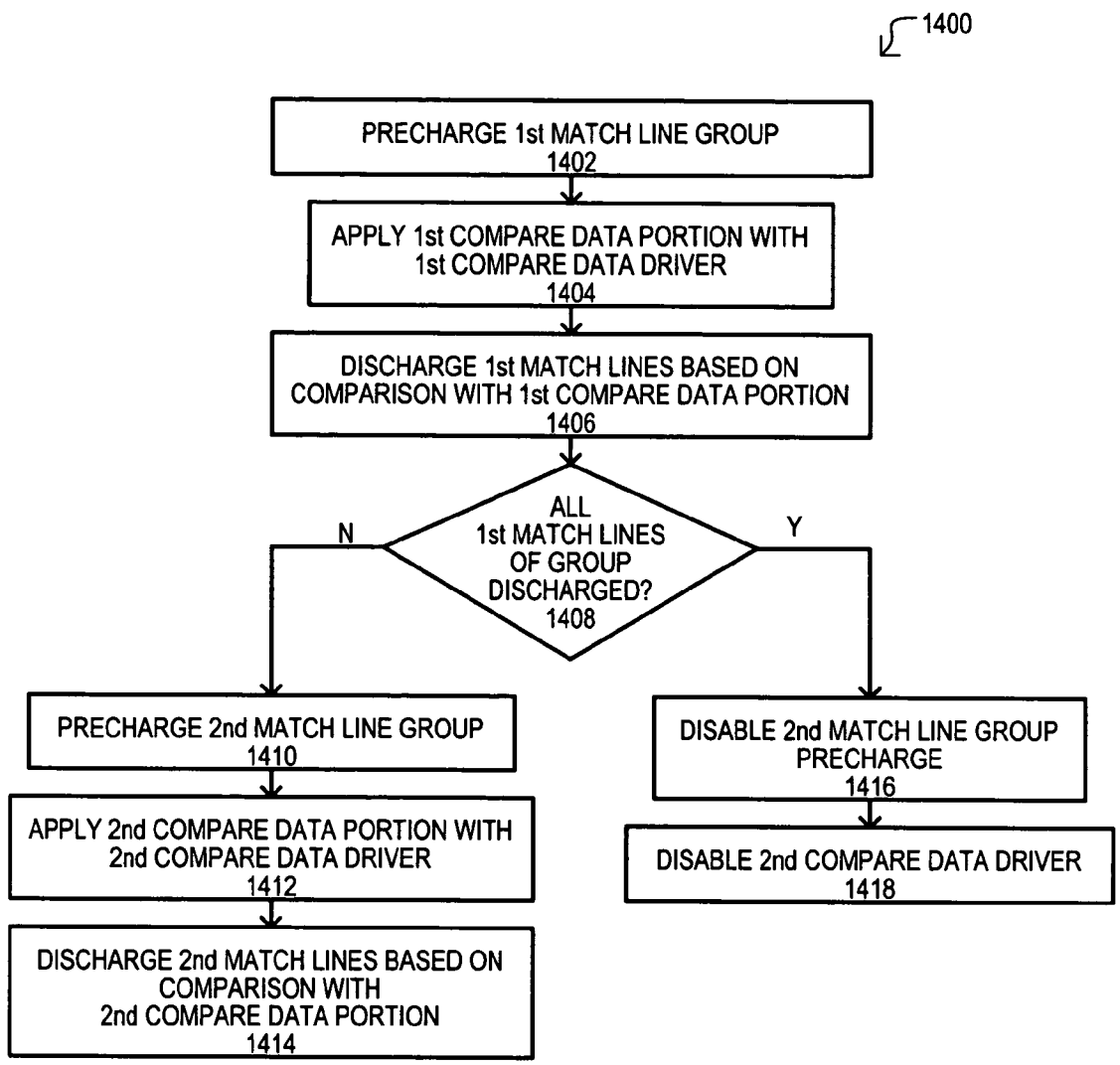
FIG. 14 is a flow diagram showing a CAM device power saving method according to another embodiment.

Another method according to the present invention is set forth in FIG. 14 and designated by the general reference character 1400. The method of FIG. 14 illustrates an arrangement in which activation of a second CAM block can be conditioned based on group compare results.

A method 1400 can include precharging a first match line group (step 1402). A first match line group can include multiple first match lines. A first compare data portion can then be applied with a first compare data driver (step 1404). Such a step can include driving compare data bit line values across a first CAM block.

As in the previous method, first match lines can be discharged based on a comparison with a first compare data portion (step 1406). However, unlike the arrangement of FIG. 13, a method 1400 can include determining if all first match lines of the group are discharged (step 1408). In the event one or more of the first match lines of the group remains precharged, compare operations can proceed in a second CAM block. In particular, a second match line group can be precharged (step 1410) and a second compare data value can be applied with a second compare data driver (step 1412). Such a step can include driving compare data bit line values across a second CAM block. Further, second match lines can be discharged based on comparison with a second compare data portion (step 1414).

If all the first match lines of the group are discharged, compare operations in a corresponding second match line group can be dispensed with, conserving power. In the particular example of FIG. 14, this can include disabling the precharge of the second match line group (step 1416). Still further, second compare data drivers can be disabled (step 1418). Such steps can conserve considerable power in a CAM device.

Of course, the embodiments set forth in FIGS. 13 and 14 describe a "miss-sense" architecture. Alternate embodiments could accommodate "hit-sense" architectures by charging match lines in the event of a HIT, as but one of the many possible variations.

It is noted that while the embodiments have shown arrangements in which a native word can be split into two portions. Alternate arrangements can include splitting a native word into a larger number of portions, and comparing each portion on subsequent clock cycles. Such an arrangement can provide even greater smoothening of power supply transients and reductions in power consumption in exchange for increased latency (but no loss in throughput).

While various embodiments have illustrated various power saving features, such arrangements should not be construed as limiting to the embodiments. Such various features can be mixed or omitted. As but one example, power savings may be accomplished by controlling compare data drivers, charging of match lines, discharging of match lines, enabling sense amplifiers, or any combination of one or more of the above.

The various embodiments of the present invention can enjoy wide application in various industries. As but one example, CAM devices and power saving methods of the present invention can be utilized in packet processing devices, such as routers and switches, as look up tables for packet forwarding, classification, and the like. In such an application power supply transients and overall power consumption can be reduced without loss of compare data throughput.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A method for reducing power consumption in a content addressable memory (CAM) device, comprising the steps of:
   receiving a compare data value of N bits in a CAM device;
   splitting the compare data value into at least two portions within the CAM device; and
   temporally staggering a compare operation between the at least two compare data value portions and a plurality of stored data values in the CAM device.

2. The method of claim 1, wherein:
   the step of temporally staggering the compare operation includes
      switching the states of first match lines in a first block of the CAM device in response to at least a first portion of the compare data value to generate first partial match results, and
      conditioning the switching of second match lines in a second block of the CAM device on the first partial match results.

3. The method of claim 2, wherein:
   each first match line has a corresponding second match line, and the first match line switches from one match state to another match state according to a comparison between the at least first portion of the compare data value and corresponding data values of the first block of the CAM device; and
   conditioning the switching of second match lines includes deactivating a sense amplifier coupled to a second match line when the corresponding first match line switches to the other match state.

4. The method of claim 2, wherein:
   each first match line is set to a first potential prior to comparing the at least first portion of the compare data value to data values of the first block of the CAM device, each first match line having a corresponding second match line, and switching to a second potential according to a compare result between the at least first portion of the compare data and a corresponding data value of the first block of the CAM device; and
   conditioning the switching of second match lines includes preventing the corresponding second match line from being set to the first potential when the corresponding first match line switches to the second potential.

5. The method of claim 2, wherein:
   the first match lines are arranged into at least one group corresponding to a group of second match lines, each first match line switching from a one match state to another match state according to a comparison between the at least first portion of the compare data value and corresponding data value portions for the first match line; and
   conditioning the switching of the of second match lines includes preventing the group of second match lines from switching from the one match state to the other match state when all of the match lines of the corresponding group of first match lines has the one match state.

6. The method of claim 2, wherein:
   the first match lines are arranged into at least one group corresponding to a group of second match lines, each first match line switching from a one match state to another match state according to a comparison between the at least first portion of the compare data value and corresponding data value portions for the first match line; and
   preventing at least a second portion of the compare data value from being applied to the second block of the CAM device when all of the match lines of the group of first match lines have the one match state.

7. The method of claim 1, wherein:
   temporally staggering the compare operation includes
      applying at least a first portion of the compare data value to a first block of the CAM device in synchronism with a first cycle of an externally applied clock signal, and
      applying at least a second portion of the compare data value to the second block of the CAM device in synchronism with a subsequent cycle of the externally applied clock signal.

8. The method of claim 1, wherein:
   temporally staggering the compare operation includes
      applying at least a first portion of a first compare data value to a first block of the CAM device in synchronism with first type transition in an externally applied clock signal,
      applying at least a first portion of the first compare data value to a third block of the CAM device in synchronism with second type transition in an externally applied clock signal,
      applying at least a second portion of the first compare data value to a second block of the CAM device in synchronism with a subsequent first type transition of the externally applied clock signal, and
      applying at least a second portion of the first compare data value to a fourth block of the CAM device in synchronism with a subsequent second type transition of the externally applied clock signal.

9. The method of claim 1, wherein:
   splitting the compare data value into at least two portions includes splitting the compare data value into greater than two portions; and
   temporally staggering the compare operation includes comparing a first portion of the compare data value in synchronism with a first clock type transition, and comparing each remaining portion on different subsequent first clock type transition.

10. A content addressable memory (CAM) device, comprising:
    a compare data input for receiving a compare data value of N bits at essentially the same time for comparison with a plurality of stored data values;
    a plurality of CAM cell blocks that each store a portion of the stored data values, each portion of the stored data values being less than N bits; and compare results of a first block of the CAM cell blocks controlling the activation of circuits in at least a second block of the CAM cell blocks.

11. The CAM device of claim 10, wherein:
each of the plurality of CAM cell blocks includes a plurality of match lines that indicates if the portions of the stored data values match a corresponding portion of the compare data value; and
second sense amplifiers corresponding to each match line of the second block, each second sense amplifier being enabled in response to the state of a corresponding first match line in the first block.

12. The CAM device of claim 10, wherein:
each of the plurality of CAM cell blocks includes a plurality of match lines that indicates if the portions of the stored data values match a corresponding portion of the compare data value; and
second precharge circuits corresponding to each match line of a second block, each second precharge circuit being enabled in response to the state of a corresponding first match line in the first block.

13. The CAM device of claim 10, further including:
each of the plurality of CAM cell blocks includes a plurality of match lines that indicate if the portions of the stored data values match a corresponding portion of the compare data value;
a detect circuit coupled to at least the first block that generates a group match indication when a plurality of match lines in the first block all indicate a predetermined match state; and
a compare data driver circuit for applying a second portion of the compare data value to the second block, the compare data driver circuit being disabled in response to the group match indication from the first block.

14. The CAM device of claim 10, wherein:
each of the plurality of CAM cell blocks includes a plurality of CAM cells selected from the group consisting of ternary CAM cells and binary CAM cells.

15. The CAM device of claim 10, further including:
the plurality of CAM cell blocks further includes at least a third block and a fourth block;
a first compare data driver circuit that applies a portion of a first compare data value to the first block in synchronism with a first type transition of an external clock signal;
a third compare data driver circuit that applies a portion of the first compare data value to the third block in synchronism with a second type transition of the external clock signal;
a second compare data driver circuit that applies another portion of the first compare data value to the second block in synchronism with a subsequent first type transition of the external clock signal; and
a fourth compare data driver circuit that applies another portion of the first compare data value to the fourth block in synchronism with a subsequent second type transition of the external clock signal.

16. A content addressable memory (CAM) device, comprising:
an input for receiving compare data values as N bits in parallel;
at least a first CAM block including a plurality of first match lines corresponding to first stored data value portions of less than N bits, each first match line providing a first match indication when the corresponding first stored data portion matches a first compare data portion, and providing a second match indication when the corresponding first stored data portion does not match the first compare data portion; and
at least a second CAM block including a plurality of second match lines corresponding to second stored data value portions of less than N bits, each second match line providing a second match indication dependent upon the first match indication of a corresponding first match line.

17. The CAM device of claim 16, wherein:
an external clock input for receiving an external clock signal;
a first CAM block that is inactive in a non-search mode and activated in a search mode; and
a second CAM block that is inactive in the non-search mode and is activated no less than about one clock cycle after the first CAM block is activated in the search mode.

18. The CAM device of claim 16, wherein:
each second match indication is also dependent upon at least one valid bit associated with the corresponding second stored data value portions.

19. The CAM device of claim 16, wherein:
the at least first CAM block includes a valid bit for each first stored data value portion that indicates if the corresponding stored data value is valid.

20. The CAM device of claim 16, wherein:
each second match indication dependence upon the first match indication is selected from the group consisting of: enabling a sense amplifier coupled to the second match line according to the first match indication, enabling a precharge circuit coupled to the second match line according to the first match indication, and enabling compare data drivers for applying a second comparand portion to the second CAM block according to a plurality of first match indications.

21. The CAM device of claim 16, wherein:
the bits of the compare data values are divided into at least a first group and second group, the first group having a greater expected variation than the second group; and
the bits of the first group are to the included in the first compare data portions and the bits of the second group are included in the second compare data portion.

* * * * *